United States Patent
Drimer

(10) Patent No.: US 7,409,610 B1
(45) Date of Patent: Aug. 5, 2008

(54) TOTAL CONFIGURATION MEMORY CELL VALIDATION BUILT IN SELF TEST (BIST) CIRCUIT

(75) Inventor: Saar Drimer, Santa Cruz, CA (US)

(73) Assignee: Xilinx, Inc., San Jose, CA (US)

( * ) Notice: Subject to any disclaimer, the term of this patent is extended or adjusted under 35 U.S.C. 154(b) by 568 days.

(21) Appl. No.: 11/185,258

(22) Filed: Jul. 20, 2005

(51) Int. Cl.
 *G01R 31/28* (2006.01)
 *G06F 7/38* (2006.01)
 *G11C 29/00* (2006.01)

(52) U.S. Cl. .......................... 714/725; 326/39; 365/201
(58) Field of Classification Search ................. 714/725, 714/733; 326/39; 365/201
See application file for complete search history.

(56) References Cited

U.S. PATENT DOCUMENTS

| | | | | |
|---|---|---|---|---|
| 6,839,873 B1 * | 1/2005 | Moore | ......................... | 714/725 |
| 6,874,110 B1 * | 3/2005 | Camarota | .................... | 714/733 |
| 6,968,487 B1 * | 11/2005 | Bryant et al. | ............... | 714/726 |
| 7,167,404 B2 * | 1/2007 | Pathak et al. | ................. | 365/201 |

OTHER PUBLICATIONS

Gericota et al., On-line Testing of FPGA Logic Blocks Using Active Replication, 2000, IEEE, pp. 1-12.*
Tahoori et al., Automatic Configuration Generation for FPGA Interconnect Testing, 2003, IEEE, pp. 1-6.*

* cited by examiner

*Primary Examiner*—Jacques Louis-Jacques
*Assistant Examiner*—John J Tabone, Jr.
(74) *Attorney, Agent, or Firm*—Thomas A. Ward

(57) ABSTRACT

A built in self test (BIST) circuit is provided for a programmable logic device (PLD) constructed from fixed or hard core logic that includes circuitry to write recurring patterns of bits in the configuration memory in a frame by frame manner and read the cell state to enable the validation of every configuration bit at power up. The BIST circuitry can further be used to program the recurring patterns into the configuration memory, and then read frames of the configuration memory to detect the occurrence of single event upsets (SEU) that corrupt data in the configuration memory. The recurring patterns programmed do not require time consuming functional configuration of the PLD, and can be done in a production environment after power up without knowledge of how the PLD will later be configured. No soft logic is needed to form the BIST circuit, enabling 100% test coverage of the programmable configuration memory cells.

14 Claims, 3 Drawing Sheets

TOTAL CONFIGURATION MEMORY CELL VALIDATION BUILT IN SELF TEST (BIST) CIRCUIT

BACKGROUND

1. Technical Field

The present invention relates to a built in self test system for a Programmable Logic Device (PLD). More particularly, the present invention relates to a BIST that detects faulty configuration memory cells and provides for debugging of various programming scenarios for configuration memory cells.

2. Related Art

Traditional PLDs such as Field Programmable Gate Arrays (FPGAs) and Complex PLDs (CPLDs) typically use millions of Static Random Access Memory (SRAM) cells forming a configuration memory to program the functionality of the implemented circuit. This programmability leads to many advantages such as ease of use, fast time-to-market, low non-recurrent engineering expenses, and on-chip design verification. With higher densities of configuration memory cells on PLDs, the configuration memory, however, is more prone to errors.

As transistor geometries become smaller and supply voltages become lower, on-chip memory cells are becoming more likely to be upset by collisions with cosmic particles, or single event upsets (SEUs). Having a greater number of configuration memory cells on a chip decreases the mean time to failure resulting from SEUs. The mean time to failure is further reduced with a higher cell density due to defects or faults in the memory cells themselves.

As PLD configuration memory density increases, it is further increasingly difficult to test for memory faults, or to account for the effect of SEUs. In particular, in order to test an IC programming, or configuration of the PLD a large number of test configurations may be required. The response to the test configurations is then monitored to determine if defects are present, or to determine the effect of SEUs. This testing is time-consuming and typically requires significant testing software provided external to the PLD.

For reference, a block diagram of components of one PLD, a conventional FPGA, is shown in FIG. 1. The FPGA includes input/output (IOBs) blocks 2 (each labeled 10) located around the perimeter of the FPGA, multi-gigabit transceivers (MGT) 4 interspersed with the I/O blocks 2, configurable logic blocks 6 (each labeled CLB) arranged in an array, block random access memory 8 (each labeled BRAM) interspersed with the CLBs, configuration logic 12, a configuration interface 14, an on-chip processor 16, and an internal configuration access port (ICAP) 15. The FPGA also includes a programmable interconnect structure (not shown) made up of traces that are programmably connectable between the CLBs 6 and IOBs 2 and BRAMs 8.

The configuration memory array 17 typically includes millions of the SRAM memory cells lying beneath the structure shown in FIG. 1. The configuration memory cells are programmed to configure the CLBs 6, IOBs 2, BRAMs 8 and appropriately connect the interconnect lines. The configuration memory array 17 can be visualized as a rectangular array of bits. The bits are grouped into frames that are one-bit wide words that extend in columns from the top of the array to the bottom. The configuration data values are typically loaded into the configuration memory array one frame at a time from the external store via the configuration interface 14.

In general, the FPGA of FIG. 1 is configured in response to a set of configuration data values that are loaded into a configuration memory array of the FPGA from an external store via configuration interface 14. Configuration interface 14 can be, for example, a parallel select map interface, a JTAG interface, or a master-serial interface. The configuration logic 12 provides circuitry for programming of the configuration memory array cells 17 typically at startup.

The FPGA can be reconfigured by rewriting data in the configuration memory array. In one reconfiguration method, the ICAP 15 is used to rewrite data in the configuration memory array in order to generate or instantiate the FPGA's internal logic (e.g., CLB's 6 and BRAMs 8). Without using the ICAP 15, reconfiguration can also be performed by loading reconfiguration frames through the configuration interface 14 using external customized logic components to overwrite frame data in the configuration memory array.

It would be desirable to use the structure of an PLD to provide a less time consuming method for testing the functionality of high density configuration memory. In particular, it would be desirable to test a configuration memory without requiring programming to configure the PLD a number of times.

SUMMARY

Embodiments of the present invention provide BIST circuitry for validating 100% of the configuration memory cells for "stuck-at" faults resulting from defects in individual configuration memory cells. The BIST circuitry further uses the ICAP to write to and read from the configuration memory cells frame by frame to enable detection of SEUs with minimal circuitry. Further, the BIST circuit enables efficient writing and read back of recurring bit patterns at power up in a production environment without knowledge of how the PLD will later be configured.

The BIST for embodiments of the present invention is constructed from fixed logic or hard core logic including circuitry to use the ICAP to write individual frames and read back the written data to enable the validation of every configuration bit. A small memory is included with the BIST circuit for storing the frame being evaluated. Testing is performed by writing and then reading back bit recurring patterns in a frame, comparing bits to the expected written pattern, noting the differences. The recurring patterns can include checkerboards, walking 1's all 0/1's etc. These bit flip patterns enable testing the configuration memory without the need to functionally configure the PLD. Testing can, thus, be performed in a production environment without knowledge of how the PLD will be configured.

In one embodiment, the hard core BIST circuitry will test all the configuration cells to provide validation on power-up. The results indicating the location of the faulty bits can then be stored in a fault location register. Contents of the fault location register can then be readout using an interface such as JTAG, typically used at powerup for programming. Since the BIST circuit and the ICAP use hard core logic, no soft logic is needed for test coverage enabling 100% of the programmable configuration memory cells to be tested.

In one embodiment, the BIST circuitry can further be used to detect and correct for SEUs using its minimal circuitry. SEUs are detected by comparing each frame read from the configuration memory with frames from a non-volatile memory storing a copy of the configuration memory.

By programming recurring patterns of 0's and 1's according to the present invention in a frame by frame manner into the configuration memory, and then checking for SEUs, vulnerability of a PLD to the occurrence of SEUs can be predicted for a PLD. Extending this capability to enable user "fault injection" further enables the thorough analysis of the susceptibility of designs to SEUs. Fault injection is performed with the BIST circuitry by randomly injecting bit faults into a functional configuration of bits stored in the configuration memory and observing how the faults affect the functionality of the PLD.

BRIEF DESCRIPTION OF THE DRAWINGS

Further details of the present invention are explained with the help of the attached drawings in which.

DETAILED DESCRIPTION

Embodiments of the present invention provide for testing the configuration memory for faults by taking advantage of partial configuration. The Virtex-4 FPGA manufactured by Xilinx, Inc. of San Jose, Calif., includes an ICAP providing for partial configuration on a frame by frame basis. Efficient partial reconfiguration of an FPGA is performed by only reading and rewriting a portion of the frames or columns in the configuration memory array at a time. Efficient operation can result using partial reconfiguration for a BIST circuit because storage of only a frame of the configuration memory is required at one time.

Figure 2:
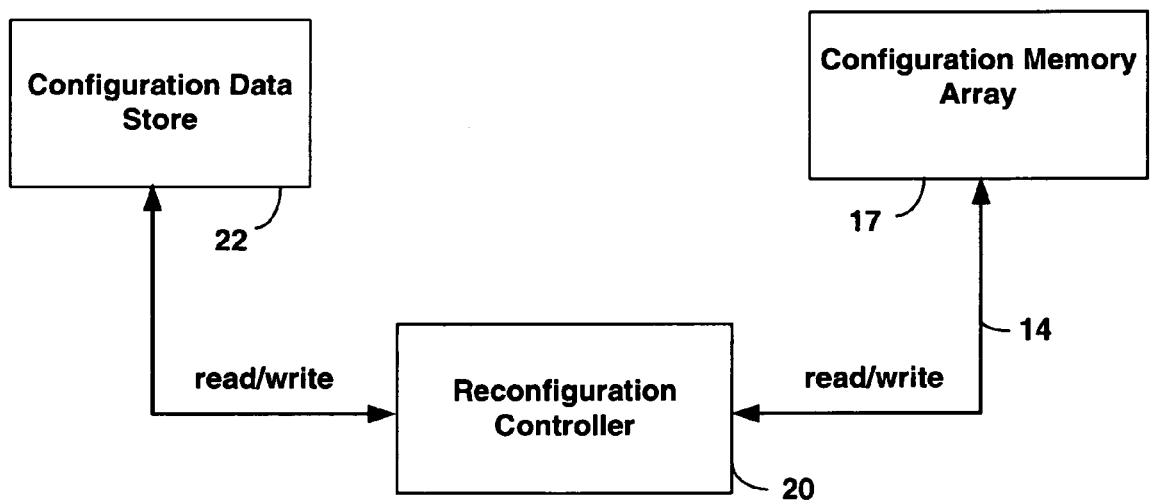
FIG. 2 shows a block diagram of components used for partial reconfiguration of an FPGA.

FIG. 2 shows one configuration of circuitry used to enable efficient partial reconfiguration using an ICAP, such as in the Virtex-4 FPGA. To control reading and writing of data into the configuration memory array 17, a controller 20 is used. The controller 20 can be included with the ICAP 15 internal to the FPGA. Alternatively, the controller 20 may be a separate device provided outside the FPGA. To mirror data in the configuration memory array 17, a non-volatile configuration store 22 is used. With the configuration store 22, to modify data, the data is first modified in the configuration store 22 and later loaded into the configuration memory array 17 through the configuration interface 14 in a frame-by-frame manner. The configuration memory 17 can further be used to check for memory faults in the configuration memory 17 by comparison of its contents with of the data in the more stable non-volatile configuration store 22.

Figure 1:
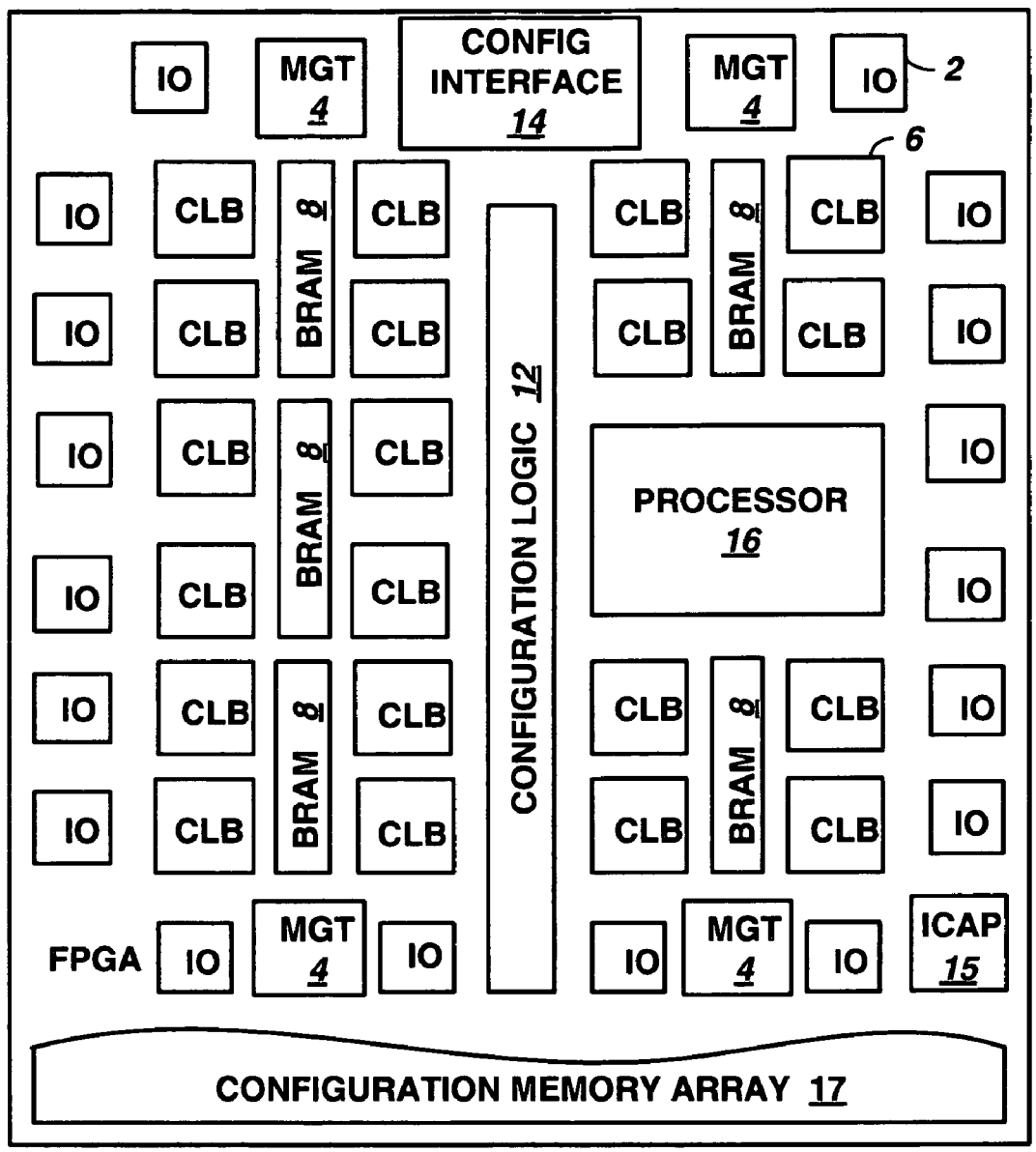
FIG. 1 shows a block diagram of typical components of an FPGA.
Figure 3:
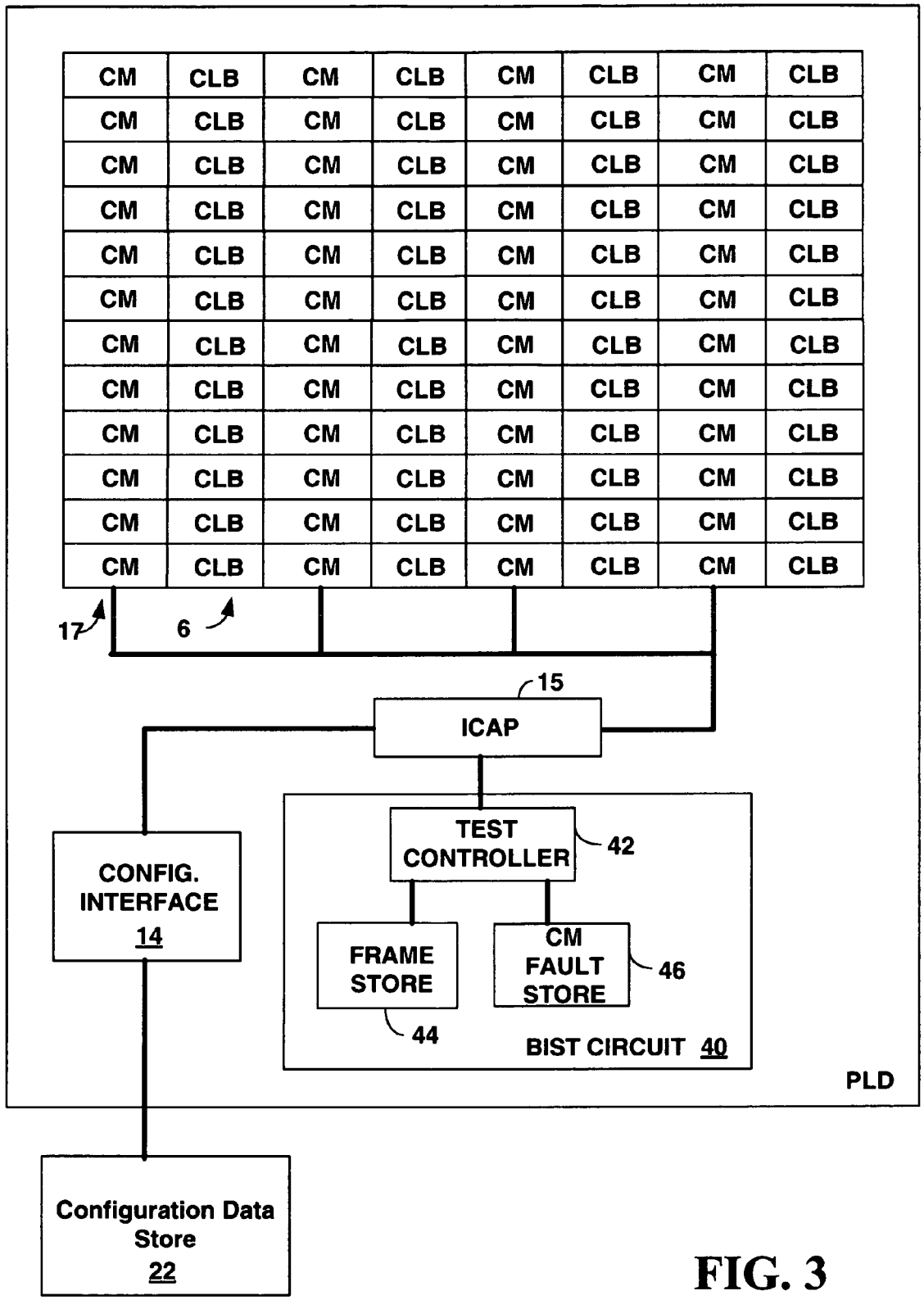
FIG. 3 shows components of a configuration memory arrangement for a PLD with BIST circuitry according to embodiments of the present invention.

FIG. 3 shows components of a configuration memory arrangement for a PLD with BIST circuitry 40 according to embodiments of the present invention. The configuration memory (labeled CM) cells 17 are shown connected to CLBs 6 of an FPGA. Use of components of an FPGA are shown for purposes of illustration and are not intended to be limiting since embodiments of the present invention can likewise be used with a configuration memory of another type PLD. Similarly, although the configuration memory cells 17 are shown connected to CLB logic 6, the configuration memory cells 17 might also be connected to logic of other elements such as an IOB 2 of FIG. 1, or the configuration cells 17 might attached to program PIPs used to interconnect routing resources of a PLD.

For programming the configuration memory cells 17 in the embodiment shown, the configuration memory cells 17 are shown connected to the ICAP 15. The ICAP 15 includes circuitry for reading and programming the configuration memory cells 17 in a frame by frame manner, as described previously. To provide for programming of the configuration memory cells, an external non-volatile memory 22 is used to store a backup of the state for the configuration memory cells 17, similar to the backup memory 22 of FIG. 2. The non-volatile memory 22 is then accessed by the ICAP 15 through the configuration interface 14 to determine the state to program for the configuration memory array cells 17 and to verify the programming state. The configuration interface 14 can be a standard memory interface, or another interface such as a JTAG interface, as described previously.

The circuitry of FIG. 3 further includes a BIST circuit 40. The BIST circuitry 40 includes a test controller 42 to access the ICAP 15 to perform read and write operations in a frame by frame manner from the configuration memory cells 17. Since the ICAP 15 provides for reading and writing in a frame by frame manner, a frame memory 44 is further included in the BIST circuit 40 that is accessed by the test controller 42 to store a frame being read or written. Although only one frame is described as being stored in frame memory 44, it is understood that a limited additional number of frames can likewise be stored depending on design requirements. Since the BIST 40 can be used to determine the location of faults in a memory, an additional memory register 46 is shown provided to store the location of the faulty configuration memory cells.

The BIST circuit 40 for embodiments of the present invention is constructed from fixed logic or hard core logic. Testing is performed for a frame by writing a recurring pattern of bits and reading the bit state to determine if the frame indeed changed to the programmed states. Recurring patterns provided in a frame can include checkerboards, walking 1's, all 0/1's etc, essentially providing a flipping of bits. The process of flipping bits to validate the configuration memory cells might prove useful in the production setting because functional configuration of the PLD is not required.

The BIST circuit 40 can validate all bits of the configuration memory 17 on power-up, or at other times when desired. When faulty configuration memory cells 17 are discovered, in one embodiment, the test controller 42 stores the location of the faulty bit in the register 46. The register can then be read through the configuration interface 14 which may be a general interface, or a JTAG interface. The fact that no soft logic is used in the BIST circuit 40 or the ICAP 15 enables testing of 100% of the programmable configuration memory cells 17 using embodiments of the present invention.

In one embodiment, the BIST circuitry 40 can further be used to detect and correct for SEUs using minimal circuitry. SEUs are detected by reading each frame from the configuration memory 17, storing the frame in memory 44 and comparing with a corresponding frame from the non-volatile memory 22 that stores a copy of the configuration memory. Hard logic is included in the BIST test controller 42 to make the comparison, and to identify the location of any SEU causing an erroneous configuration memory cell data bit. For one or more cells with SEUs causing errors, the correct data is then provided in the memory 44 from the non-volatile memory 22, and the frame is rewritten into the configuration memory 17 using the ICAP as controlled by the BIST control circuit 42.

In a further embodiment of the present invention to evaluate the possible occurrence of SEUs, patterns of 0's and 1's are programmed in a frame by frame manner into the configuration memory, and then the procedure described above is used to check for SEUs. Vulnerability of the PLD to the occurrence of SEUs can be then predicted. Extending this capability to enable user "fault injection" further enables the thorough analysis of the susceptibility of designs to SEUs. Fault injection is performed with the BIST circuitry 40 by randomly injecting bit faults in bits used to functionally configure the logic PLD to operate in a predicted way and observing how the bit faults affect the functionality of the configuration. If the configuration is significantly affected, the user can decide how to deal with such vulnerability. The hard core BIST circuit used in this process enables testing 100% of the configuration memory logic, giving an accurate indication to the end user of the effect of faults.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for testing configuration memory cells of a programmable logic device (PLD), the method comprising:
   storing a recurring pattern of bits in a frame of the configuration memory cells;
   reading back the bits from the frame of the configuration memory cells; an
   determining the location of cells in the configuration memory cells storing faulty bits in the frame,
   wherein the step of storing and the step of reading back bits are performed with hard core logic in the PLD, and
   wherein the recurring pattern of bits does not functionally configure the PLD.

2. The method of claim 1, further comprising:
   storing the location of the memory cells determined to have faulty bits in a fault storage memory.

3. The method of claim 2, wherein the fault storage memory is accessible through a boundary scan interface.

4. The method of claim 1 further comprising storing data in the configuration memory cells to functionally configure the PLD after said step of determining.

5. The method of claim 1, wherein the bits are read from the configuration memory cells and stored in the configuration memory cells using an internal configuration access port (ICAP).

6. The method of claim 1, wherein the configuration memory cells are stored in the configuration memory one frame at a time and read from the configuration memory one frame at a time.

7. The method of claim 1, further comprising storing bits read from the configuration memory into a register capable of storing a limited number of frames from the configuration memory.

8. A method for testing configuration memory cells of a programmable logic device (PLD), the method comprising:
   storing configuration data in the configuration memory cells to functionally configure the PLD, wherein the configuration data is stored frame by frame into the configuration memory array;
   reading the configuration data stored in the configuration memory in a frame by frame manner; and
   comparing a frame of the configuration data read with additional configuration data stored in a separate memory to determine if a single event upset (SEU) changed a state of a cell of the configuration memory array,
   wherein the step of storing and the step of reading back bits is performed with hard core logic in the PLD, and
   wherein the configuration data does not functionally configure the PLD.

9. The method of claim 8, further comprising:
   writing a corrected frame back to the configuration memory array when a single event upset (SEU) is determined to change the state of a cell of the frame read.

10. The method of claim 8, further comprising:
    storing at least one fault in the configuration data; and
    operating the PLD to evaluate the effect of the at least one fault.

11. A programmable logic device (PLD) comprising:
    configuration memory cells;
    configuration logic formed in a first hard core logic of the PLD connected to read and write to the configuration memory cells; and
    a built in self test (BIST) circuit with a second hard core logic, the BIST circuit controlling the configuration logic to:
    store a predetermined pattern of bits in a frame of the configuration memory cells; and
    read back from the frame of memory cells the state of bits of the frame of the memory cells,
    wherein the second hard core logic of the BIST circuit detects if any faults occurred in the frame of memory cells read back, and
    wherein the predetermined pattern of bits does not functionally configure the PLD.

12. The PLD of claim 11, wherein the BIST circuit further comprises:
    a fault location memory accessed by the second hard core logic of the BIST to store the location of any faults detected.

13. The PLD of claim 12, further comprising:
    a port of a boundary scan interface connected to read data from the fault location memory.

14. The PLD of claim 11, wherein the BIST circuit further comprises:
    a memory register for storing the frame read using the BIST circuit to enable the BIST circuit to detect if any faults occurred.

* * * * *